(12) United States Patent
Bauer et al.

(10) Patent No.: US 6,933,747 B1
(45) Date of Patent: Aug. 23, 2005

(54) STRUCTURES AND METHODS OF TESTING INTERCONNECT STRUCTURES IN PROGRAMMABLE LOGIC DEVICES

(75) Inventors: Trevor J. Bauer, Boulder, CO (US); Steven P. Young, Boulder, CO (US); Ramakrishna K. Tanikella, Boulder, CO (US)

(73) Assignee: Xilinx, Inc., San Jose, CA (US)

( * ) Notice: Subject to any disclaimer, the term of this patent is extended or adjusted under 35 U.S.C. 154(b) by 129 days.

(21) Appl. No.: 10/684,183

(22) Filed: Oct. 10, 2003

(51) Int. Cl.⁷ .......................................... H03K 19/173
(52) U.S. Cl. .......................................... 326/38; 326/41
(58) Field of Search ............................... 326/16, 37–41

(56) References Cited

U.S. PATENT DOCUMENTS

| | | | | |
|---|---|---|---|---|
| 5,157,627 | A | * 10/1992 | Gheewala | 365/189.01 |
| 5,675,589 | A | * 10/1997 | Yee | 714/30 |
| 5,914,616 | A | 6/1999 | Young et al. | |
| 5,970,005 | A | * 10/1999 | Yin et al. | 365/201 |
| 6,202,182 | B1 | * 3/2001 | Abramovici et al. | 714/725 |
| 6,874,110 | B1 | * 3/2005 | Camarota | 714/733 |

OTHER PUBLICATIONS

Xilinx, Inc.; "The Programmable Logic Data Book 2000"; published Apr. 2000; available from Xilinx, Inc., 2100 Logic Drive, San Jose, California 95124; pp 3-75 through 3-96.
Xilinx, Inc.; "Virtex-II Platform FPGA Handbook"; published Dec. 2000; available from Xilinx, Inc., 2100 Logic Drive, San Jose, California 95124; pp 33-75.
Xilinx, Inc.; "Virtex-II Pro Platform FPGA Handbook"; published Oct. 14, 2002; available from Xilinx, Inc., 2100 Logic Drive, San Jose, California 95124; pp 3-75 through 19-71.
Neil H.E. Weste and Kamran Eshraghian; "Principles of CMOS VLSI Design—A Systems Perspective"; Chapter 7; Second Edition; published by Addison-Wesley; Copyright 1993; pp. 466-510, no month.

* cited by examiner

*Primary Examiner*—Don Le
(74) *Attorney, Agent, or Firm*—Lois D. Cartier

(57) ABSTRACT

Structures enabling the efficient testing of interconnect in programmable logic devices (PLDS), and methods utilizing these structures. A PLD includes a non-homogeneous array of programmable logic blocks and an array of standardized interconnect blocks, where the same interconnect block is used for different types of logic blocks. Coupled between each of the interconnect blocks and the associated logic block is a standardized test structure, allowing the same test configuration to be used for each interconnect block even though the interconnect blocks are associated with logic blocks of different types. In some embodiments, one or more types of logic blocks are not associated with standardized test structures. These logic blocks are coupled directly to their associated interconnect blocks, and are preferably of a type that can be configured to emulate the standardized test structure. Thus, by a correct application of configuration data all of the interconnect blocks display the same behavior.

31 Claims, 7 Drawing Sheets

STRUCTURES AND METHODS OF TESTING INTERCONNECT STRUCTURES IN PROGRAMMABLE LOGIC DEVICES

FIELD OF THE INVENTION

The invention relates to Programmable Logic Devices (PLDs). More particularly, the invention relates to structures and methods of testing programmable interconnect structures in PLDs.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of configurable logic elements (CLEs) and programmable input/output blocks (IOBs). A CLE typically includes programmable logic elements such as function generators, memory elements (e.g., flip-flops), and so forth. The CLEs and IOBs are interconnected by a programmable interconnect structure. Some FPGAs also include additional logic blocks with special purposes (e.g., DLLs, RAM, processors, and so forth).

The interconnect structure, CLEs, IOBs, and other logic blocks are typically programmed by loading a stream of configuration data (bitstream) into internal configuration memory cells that define how the logic blocks and interconnect are configured. The configuration data can be read from memory (e.g., an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

Note that the term PLD as used herein is not limited to FPGAs and CPLDs. However, FPGAs are used as examples of PLDs to which the structures and methods of the invention can readily be applied.

One type of FPGA, the Xilinx Virtex® FPGA, is described in detail in pages 3–75 through 3–96 of the Xilinx 2000 Data Book entitled "The Programmable Logic Data Book 2000", published April, 2000, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.) Young et al. further describe the interconnect structure of the Virtex FPGA in U.S. Pat. No. 5,914,616, issued Jun. 22, 1999 and entitled "FPGA Repeatable Interconnect Structure with Hierarchical Interconnect Lines", which is incorporated herein by reference in its entirety.

As was briefly mentioned above, advanced FPGAs can include several different types of logic blocks in their programmable arrays. For example, in addition to CLEs and IOBs, the Xilinx Virtex®-II FPGA includes blocks of Random Access Memory (RAM) and digital clock manager (DCM) blocks. (The Xilinx Virtex-II FPGA is described in pages 33–75 of the "Virtex-II Platform FPGA Handbook", published December, 2000, available from Xilinx, Inc., which pages are incorporated herein by reference.) The Xilinx Virtex-II Pro™ FPGA also includes embedded processor blocks. (The Xilinx Virtex-II Pro FPGA is described in pages 19–71 of the "Virtex-II Pro Platform FPGA Handbook", published Oct. 14, 2002 and available from Xilinx, Inc., which pages are incorporated herein by reference.) Some of these FPGAs also include other types of logic blocks.

FPGA interconnect structures are typically very complex, and can include hundreds of thousands of programmable interconnect points (PIPs) that control the interconnections among the interconnect lines and between the interconnect lines and the other elements in the device. Because the user circuit to be implemented in an FPGA is unknown at the time of testing, a user design might make use of any of these PIPs and interconnect lines. Therefore, ideally every PIP and every interconnect line is tested during the FPGA production process. There can be exceptions, which might include, for example, PIPs included in the device that are not accessible to the design software and that will therefore never be used. However, the vast majority of PIPs and interconnect lines should be tested. Clearly, the testing procedure can be a time-consuming and expensive process, significantly impacting the production cost and thus the sales price of the FPGA.

Therefore, it is desirable to provide structures and methods that simplify the testing process for programmable interconnect structures in PLDs.

SUMMARY OF THE INVENTION

The invention provides structures enabling the efficient testing of programmable interconnect structures in PLDS, and methods utilizing these structures. A PLD includes a non-homogeneous array of programmable logic blocks, i.e., an array including at least two different types of logic blocks. Also included are an array of standardized interconnect blocks, where essentially the same interconnect block design is used regardless of the type of logic block with which it is associated. Coupled between each of the standardized interconnect blocks and the associated logic block is a standardized test structure. The standardized test structure allows the same test configuration to be used for each interconnect block, even though the interconnect blocks are associated with logic blocks of different types.

In some embodiments, one or more types of logic blocks are not associated with standardized test structures. These logic blocks are coupled directly to their associated standardized interconnect blocks, and are preferably of a type that can be configured to emulate the standardized test structure. Thus, while a different configuration pattern must be applied to obtain the same behavior, by a correct application of configuration data all of the interconnect blocks display the same behavior to the tester system.

According to another aspect of the invention, a method of testing is applied to a PLD that includes an array of standardized interconnect blocks coupled to one another, an array of standardized test structures each coupled to and associated with one of the interconnect blocks, and a non-homogeneous array of programmable logic blocks each coupled to and associated with at least one of the test structures. The first step of the method is to configure the PLD with a configuration containing signal paths that traverse the standardized interconnect blocks and the standardized test structures and bypass the logic blocks. The configuration is the same for each of the standardized interconnect blocks and standardized test structures associated with each of the logic blocks. After configuring the PLD, an input test signal is applied to a start point, and observed at an end point, of each of the signal paths.

In some embodiments, the non-homogeneous array of programmable logic blocks includes additional logic blocks coupled directly to the interconnect blocks (i.e., rather than being coupled through one of the standardized test structures), and the additional logic blocks are configured to mimic the behavior of the standardized test structures in test mode.

BRIEF DESCRIPTION OF THE DRAWINGS

The present invention is illustrated by way of example, and not by way of limitation, in the following figures.

DETAILED DESCRIPTION OF THE DRAWINGS

The present invention is believed to be applicable to a variety of programmable logic devices (PLDs). The present invention has been found to be particularly applicable and beneficial when applied to field programmable gate arrays (FPGAs). While the present invention is not so limited, an appreciation of the present invention is presented by way of specific examples, in this instance with an FPGA including a non-homogeneous array of programmable logic blocks.

Figure 1:
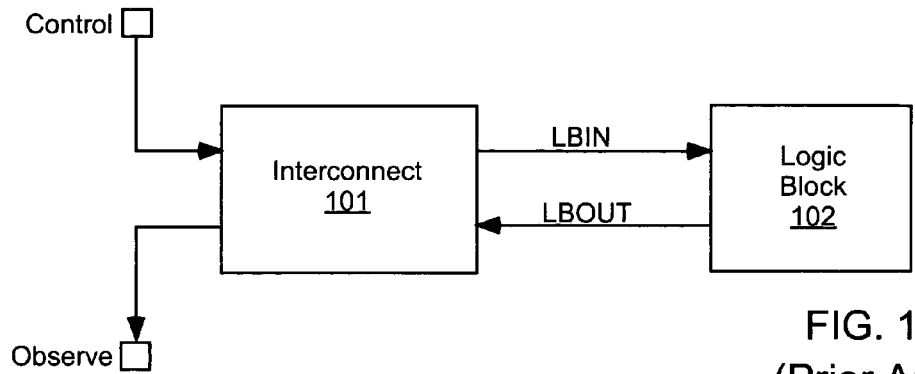
FIG. 1 is a block diagram showing a PLD logic block and an associated interconnect block and illustrating how the interconnect block is tested using known methods.

FIG. 1 is a block diagram showing a PLD logic block and an associated interconnect block and illustrating how the interconnect block is tested using known methods. The PLD array is laid out as a set of "tiles", each of which includes a logic block 102 and an associated interconnect block 101. Interconnections between logic blocks are made by traversing, for example, signal line LBOUT, at least two interconnect blocks 101, and a signal line LBIN. (Note that in the present specification, the same reference characters are used to refer to terminals, signal lines, and their corresponding signals.) Note that some PLDs also include interconnect lines that couple together two logic blocks without traversing any interconnect blocks, e.g., carry signals, shift cascade signals, and so forth. These signals are not addressed by the test methods described herein, which are directed to the interconnect lines included in the interconnect blocks.

Each interconnect block includes a large number of interconnect lines and programmable interconnect points (PIPs) (not shown). Each PIP should be tested for on/off capability, and each interconnect line should be tested for manufacturing defects, e.g., to ensure that the interconnect line is not broken or shorted to an adjacent interconnect line. To perform this testing, the PLD is configured to implement a signal path that traverses various interconnect lines and PIPs within interconnect block 101. A test input signal (Control) is supplied at a start point of the signal path, e.g., from a programmable input block or an IOB of the PLD, or from an internally generated signal source. A test output signal (Observe) is monitored at an end point of the signal path, e.g., at a programmable output block or an IOB of the PLD, or at an internal node that is externally observable by a test apparatus. The PLD is then reconfigured to implement another signal path that traverses another set of interconnect lines and PIPs within interconnect block 101. Thus, the functionality of many interconnect lines and PIPs within the interconnect block can be tested, given a large enough set of signal paths.

However, the testing process becomes more complicated when testing the interconnections between interconnect block 101 and logic block 102. Signals LBIN, for example, are not easily observable because they drive the logic block rather than simply feeding through the interconnect block. Therefore, signals LBIN cannot be directly observed; the logic block must first be configured and the signals can then be observed only by observing output signals from the logic block. On the other hand, signals LBOUT are not easily controllable, because they are driven by the logic block rather than by a signal from the interconnect block. Clearly, to test interconnect lines and PIPs contributing to these connections, signal paths must be routed through logic block 102.

Depending on the nature of logic block 102, it can be either a simple matter or a complicated one (or even an impossible task) to drive a signal from signal line LBIN through logic block 102 and back through signal line LBOUT. For example, if logic block 102 is a configurable logic element (CLE) containing a lookup table (LUT), it is generally a simple matter to configure the LUT to provide the signal on line LBIN back to line LBOUT. However, if logic block 102 is a microprocessor block, for example, this connection might be difficult to make. Further, traversing some logic blocks (e.g., microprocessor blocks) can have a significant delay that can include, for example, many levels of pipelining.

Figure 2:
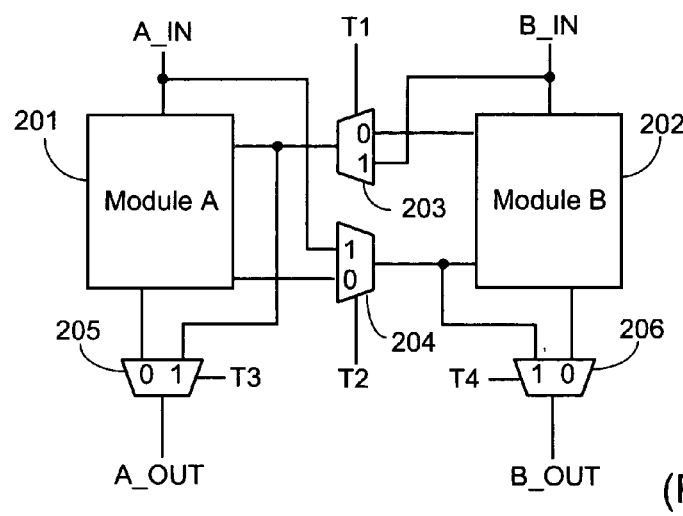
FIG. 2 shows a known structure that can be used to facilitate testing of logic in integrated circuits.

FIG. 2 illustrates one known solution to the challenge of testing multiple modules in electronic systems. The system shown in FIG. 2 includes two interconnected logic modules, Module A (201) and Module B (202). By adding multiplexer logic controlled by test control signals, pathways can be created that traverse one of the modules but not the other module, thereby simplifying the testing process for each module.

Multiplexer (MUX) 203 selects, under control of test signal T1, between an input terminal B_IN to module B and an output terminal from module B. The selected signal is provided to module A. MUX 204 selects, under control of test signal T2, between an input terminal A_IN to module A and an output terminal from module A. MUX 205 selects, under control of test signal T3, between an output terminal from module A and the output of MUX 203. MUX 206 selects, under control of test signal T4, between an output terminal from module B and the output of MUX 204.

Figures 2A, 2B:
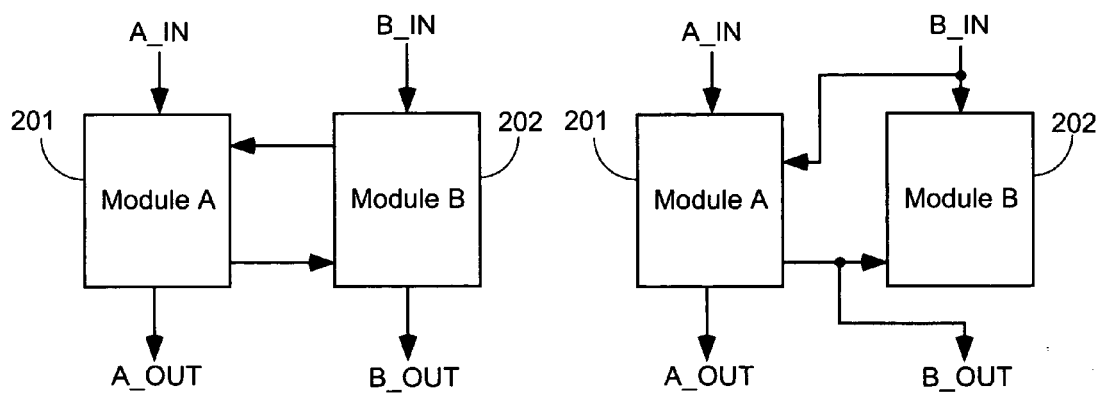
FIG. 2A shows how the circuit of FIG. 2 functions in operational mode.
FIG. 2B shows how the circuit of FIG. 2 functions in test mode, wherein Module A is being tested.

FIG. 2A illustrates a first configuration of the system shown in FIG. 2, in which the test function is disabled. Test signals T1–T4 are all low. Thus, module A provides signals to module B, module B provides signals to module A, module A communicates with external circuits via signals A_IN and A_OUT, and module B communicates with external circuits via signals B_IN and B_OUT.

FIG. 2B illustrates one test configuration for the system shown in FIG. 2, in which module A is tested and module B is bypassed. Test signals T1 and T4 are high, and test signals T2 and T3 are low. Thus, signal B_IN is directed through MUX 203 to module A, and an output signal from module A is directed through MUXes 204 and 206 to output terminal B_OUT. Terminals B_IN and B_OUT can then be used to test module A, using a signal path that bypasses module B.

Figure 3A:
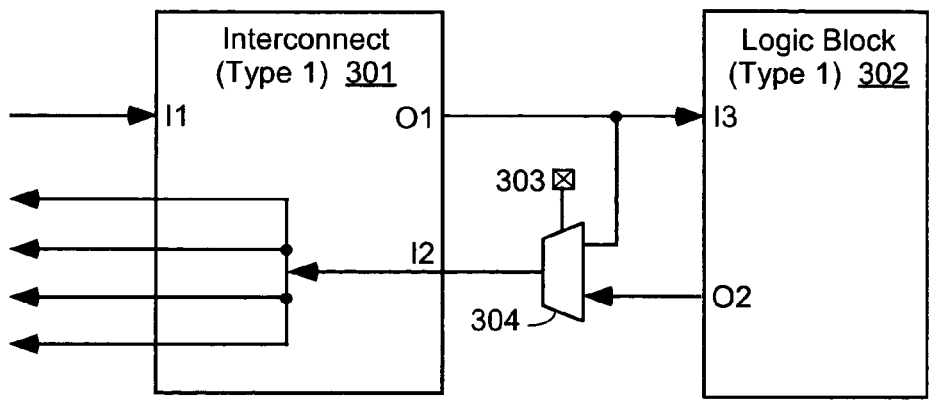
FIGS. 3A–3C show three testing structures included in some known PLDs.
Figure 3B:
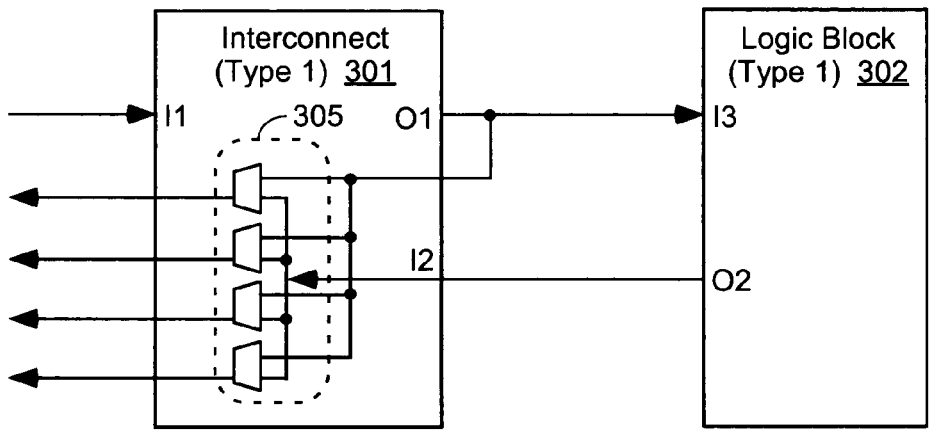
Figure 3C:
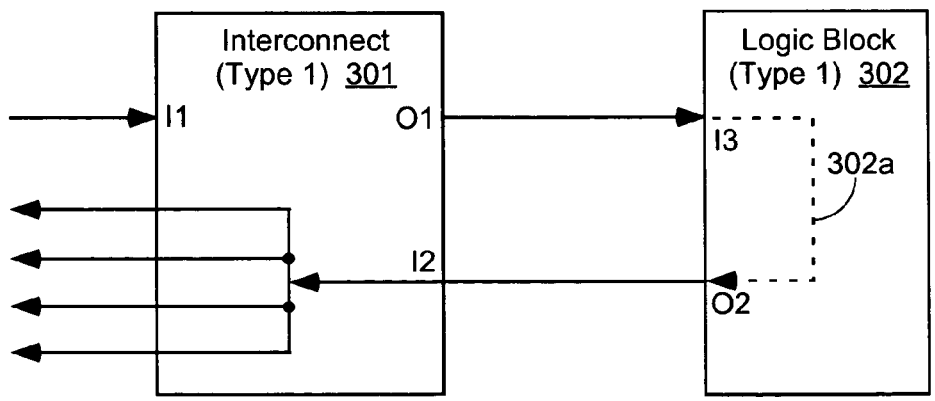

FIGS. 3A–3C show three testing structures included in known FPGAs. The FPGA of FIGS. 3A–3C includes several different types of logic blocks, of which only one is shown. Logic block 302 is of "Type 1". Type 1 can be, for example, a CLE, an IOB, a BRAM, or a DCM block. Each type of logic block has its own interconnect block specific to that type of logic block. For example, a Type 1 logic block 302 in FIGS. 3A–3C has an associated Type 1 interconnect block 301. A Type 2 logic block (not shown) has an associated Type 2 interconnect block different from the Type 1 interconnect block. In the FPGA of FIGS. 3A–3C, Type 1 interconnect block 301 includes interconnect resources (e.g., interconnect lines and PIPs) that are tested in various ways.

FIG. 3A illustrates how interconnect resources can be tested using dedicated test MUXes as in the system of FIG. 2. For example, MUX 304 is configured using memory cell 303 to select either a signal path from output terminal O2 of logic block 302 to input terminal I2 of interconnect block 301, or a test signal path from output terminal O1 of interconnect block 301, through MUX 304, and back to input terminal I2 of interconnect block 301.

FIG. 3B illustrates how interconnect resources can be tested by routing back through MUXes already included in interconnect block 301 and also used for routing user signals when in user operational mode. For example, MUXes 305 can be configured to select either a signal path from output terminal O2 of logic block 302, or a test signal path from output terminal O1 of interconnect block 301.

FIG. 3C illustrates how interconnect resources can be tested by configuring logic block 302 to implement a signal path 302a through the logic block from input terminal I3 to output terminal O2.

In addition to the several different types of test signal paths shown in FIG. 3, it is important to note that these signal paths can only be used for interconnect and logic blocks of Type 1. Similar, but different, test signal paths are used for the other types of interconnect and logic blocks in the FPGA. Thus, preparing test patterns for the interconnect structure of the FPGA of FIG. 3 can be a complicated and time-consuming process.

Figure 4:
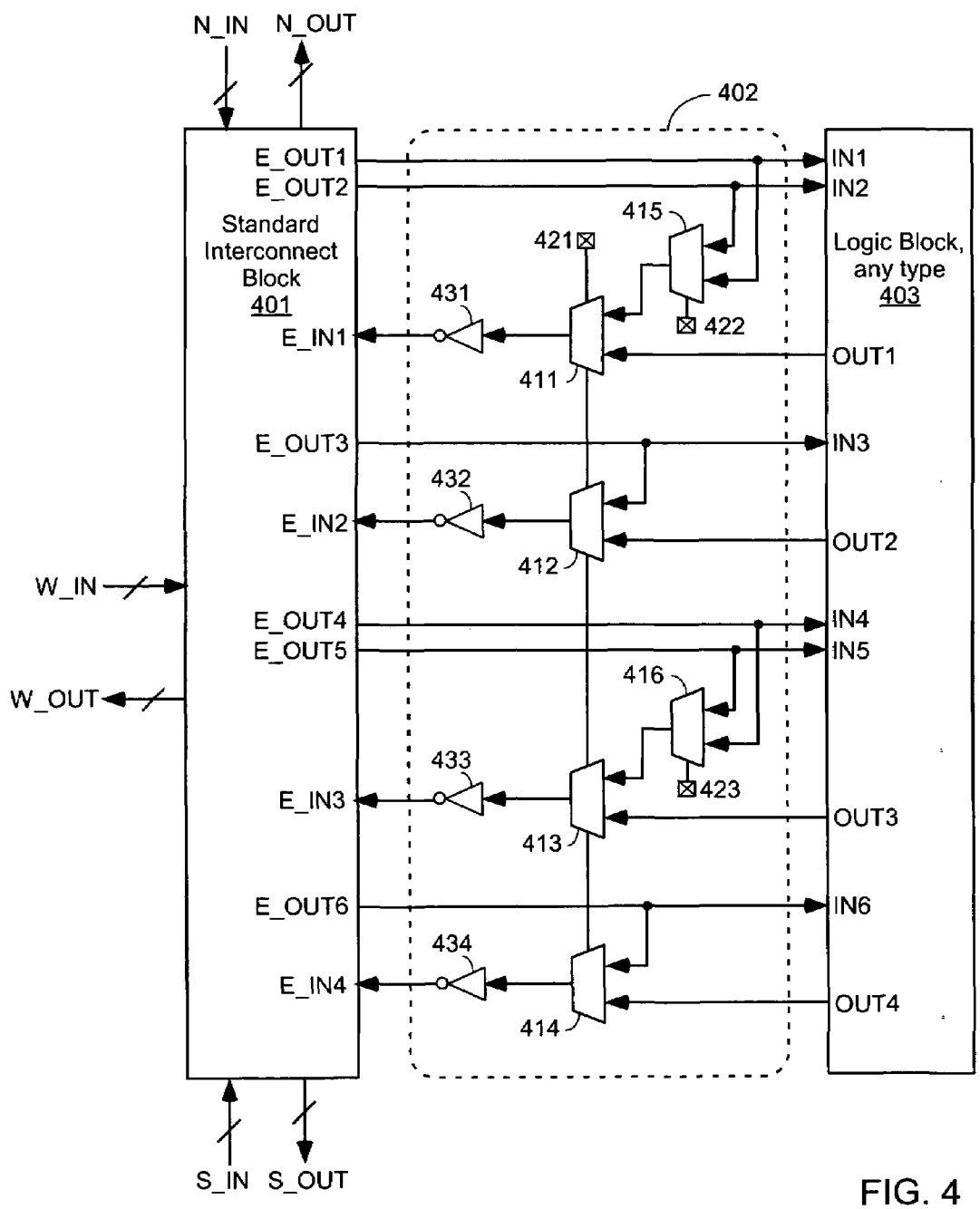
FIG. 4 shows a novel testing structure and standardized interconnect block that can be used to simplify testing in PLDS, according to an embodiment of the present invention.

FIG. 4 shows a portion of an FPGA that overcomes these limitations of the prior art. The FPGA of FIG. 4 includes a non-homogeneous array of logic blocks, of which only a single logic block 403 is illustrated, for clarity. A standardized interconnect block 401 is used for all types of logic blocks included in the FPGA. In some embodiments, the standardized interconnect blocks are all logically equivalent. In other embodiments, the standardized interconnect blocks include minor variations that do not affect the test processes described herein. Inserted between the standardized interconnect block 401 and the logic block 403 is a standardized test structure 402.

In some embodiments, the standardized test structure is inserted between each logic block, of every type, and the associated standardized interconnect block. In other embodiments, the standardized test structure is included for some types of logic blocks, and not for others. For example, when the logic block is a CLE, the logic block can generally be configured to emulate the standardized test structure. In other words, the programmable logic in the CLE can be used to implement the multiplexers and interconnections included in the standardized test structure.

Thus, in some embodiments these logic blocks are coupled directly to their associated standardized interconnect blocks. While a specialized configuration pattern must be applied to the CLEs for testing purposes, by a correct application of configuration data the interconnect blocks associated with the CLEs display the same behavior as the interconnect blocks associated with other types of logic blocks. Test patterns for this embodiment require somewhat more time to prepare than when standardized test structures are used for all logic blocks, but the timing of the speed-critical CLEs is not adversely affected by passing through the MUXes in the standardized test structures. Further, omitting the standardized test structures for CLEs reduces the surface area of the integrated circuit, or makes available additional surface area that can potentially be used by the CLEs.

Returning now to FIG. 4, output signals E_OUT1–E_OUT6 are provided to standardized test structure 402 and to input terminals IN1–IN6 of logic block 403.

Standardized test structure 402 includes MUXes 411–416, configuration memory cells 421–423, and inverting buffers 431–434. Under control of memory cell 422, MUX 415 selects one of signals E_OUT1 and E_OUT2 from standardized interconnect block 401 to pass to MUX 411. Under control of memory cell 421, MUX 411 selects one of signal OUT1 from logic block 403 and the output of MUX 415 to pass to buffer 431, and hence to input terminal E_IN1 of standardized interconnect block 401. Under control of memory cell 421, MUX 412 selects one of signal OUT2 from logic block 403 and output signal E_OUT3 from standardized interconnect block 401 to pass to buffer 432, and hence to input terminal E_IN2 of standardized interconnect block 401.

Similarly, under control of memory cell 423, MUX 416 selects one of signals E_OUT4 and E_OUT5 from standardized interconnect block 401 to pass to MUX 413. Under control of memory cell 421, MUX 413 selects one of signal OUT3 from logic block 403 and the output of MUX 416 to pass to buffer 433, and hence to input terminal E_IN3 of standardized interconnect block 401. Under control of memory cell 421, MUX 414 selects one of signal OUT4 from logic block 403 and output signal E_OUT6 from standardized interconnect block 401 to pass to buffer 434, and hence to input terminal E_IN4 of standardized interconnect block 401.

Note that in the pictured embodiment MUXes 411–414 are all controlled by the same configuration memory cell 421. Thus, when in user operational mode (i.e., when a first value is stored in memory cell 421), output signals OUT1–OUT4 from logic block 403 are provided to input terminals E_IN1-E_IN4, respectively. When in test mode (i.e., when a second and opposite value is stored in memory cell 421), a selected four of signals E_OUT1–E_OUT6 are provided to input terminals E_IN1–E_IN4 of standardized interconnect block 401. The selection of the four signals is controlled in the pictured embodiment by memory cells 422–423 and MUXes 415–416.

The number and arrangement of the test MUXes in FIG. 4 is purely exemplary. In some embodiments, other numbers and arrangements of test MUXes are included in the standardized test structure. For example, the number of test MUXes and the number of MUXes coupled in series can depend on the numbers of signals passing in either direction between the standardized interconnect block and the logic block. In some embodiments, inverting buffers 431–434 are omitted, or are replaced by non-inverting buffers. It will be apparent to one skilled in the art after reading this specification that the present invention can be practiced within these and other architectural variations.

Figure 5:
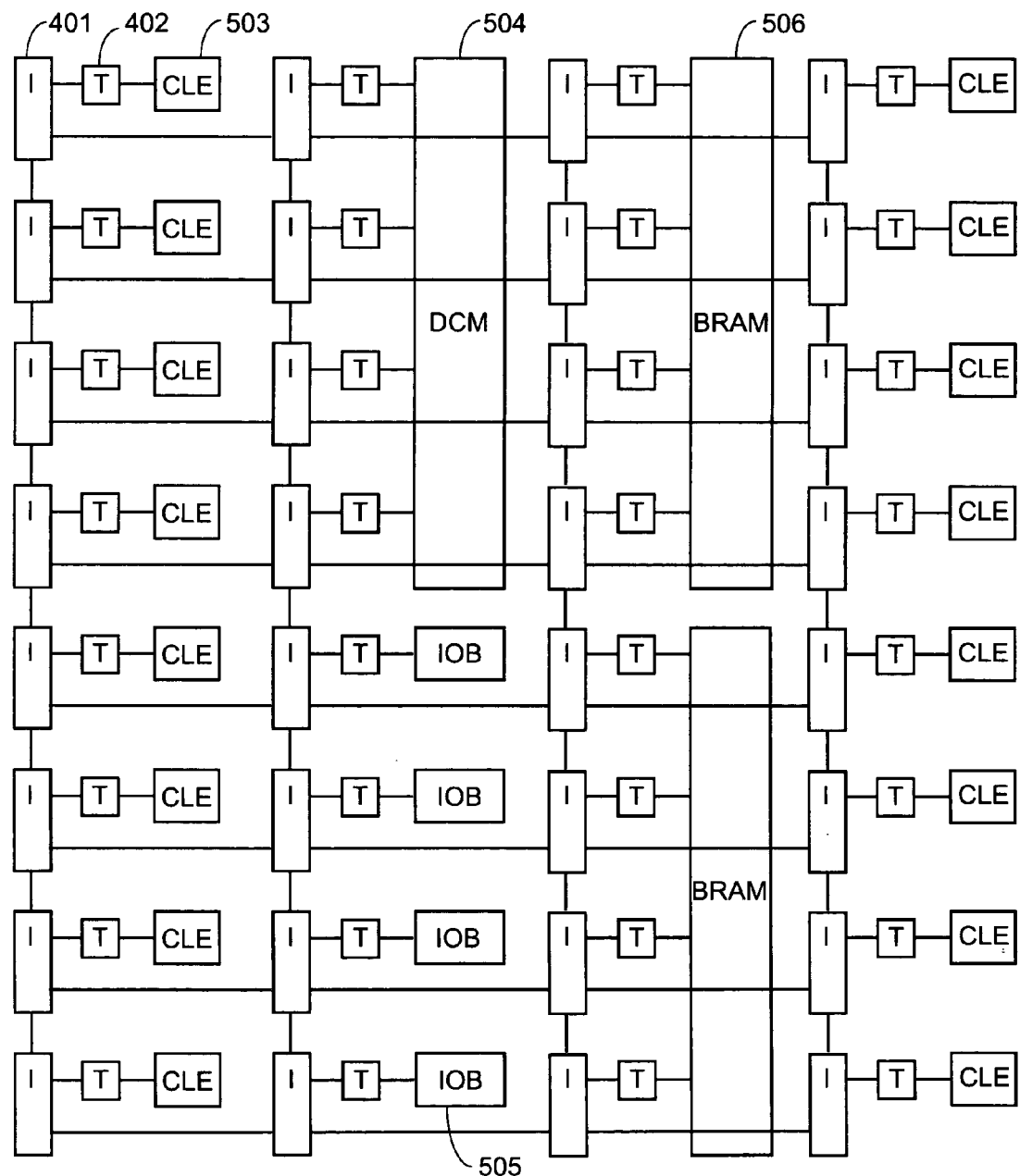
FIG. 5 is a block diagram of a first PLD array that includes the testing structure and standardized interconnect block of FIG. 4 in a non-homogeneous array of logic blocks.

FIG. 5 is a block diagram of a first PLD array that can include, for example, the standardized testing structure and standardized interconnect block of FIG. 4 in a non-homogeneous array of logic blocks.

The PLD of FIG. 5 includes standardized interconnect blocks 401, standardized test blocks 402, and non-homogeneous logic blocks 503–506. The types of logic blocks included in the exemplary programmable array include CLEs 503, DCMs 504, IOBs 505, and BRAMs 506. The standardized interconnect blocks 401 are coupled to other interconnect blocks 401 adjacent in the array, and each interconnect block 401 has an associated standardized test structure 402 through which the interconnect block is coupled to an associated logic block. Note that some of the logic blocks (in the pictured embodiment the BRAMs and DCMs) are associated with more than one test structure and interconnect block. In some embodiments (not shown), some interconnect blocks and test structures are associated with more than one logic block. However, in each case the interfaces of the logic blocks are designed to maintain the standard interface with the standardized test structures.

Figure 6:
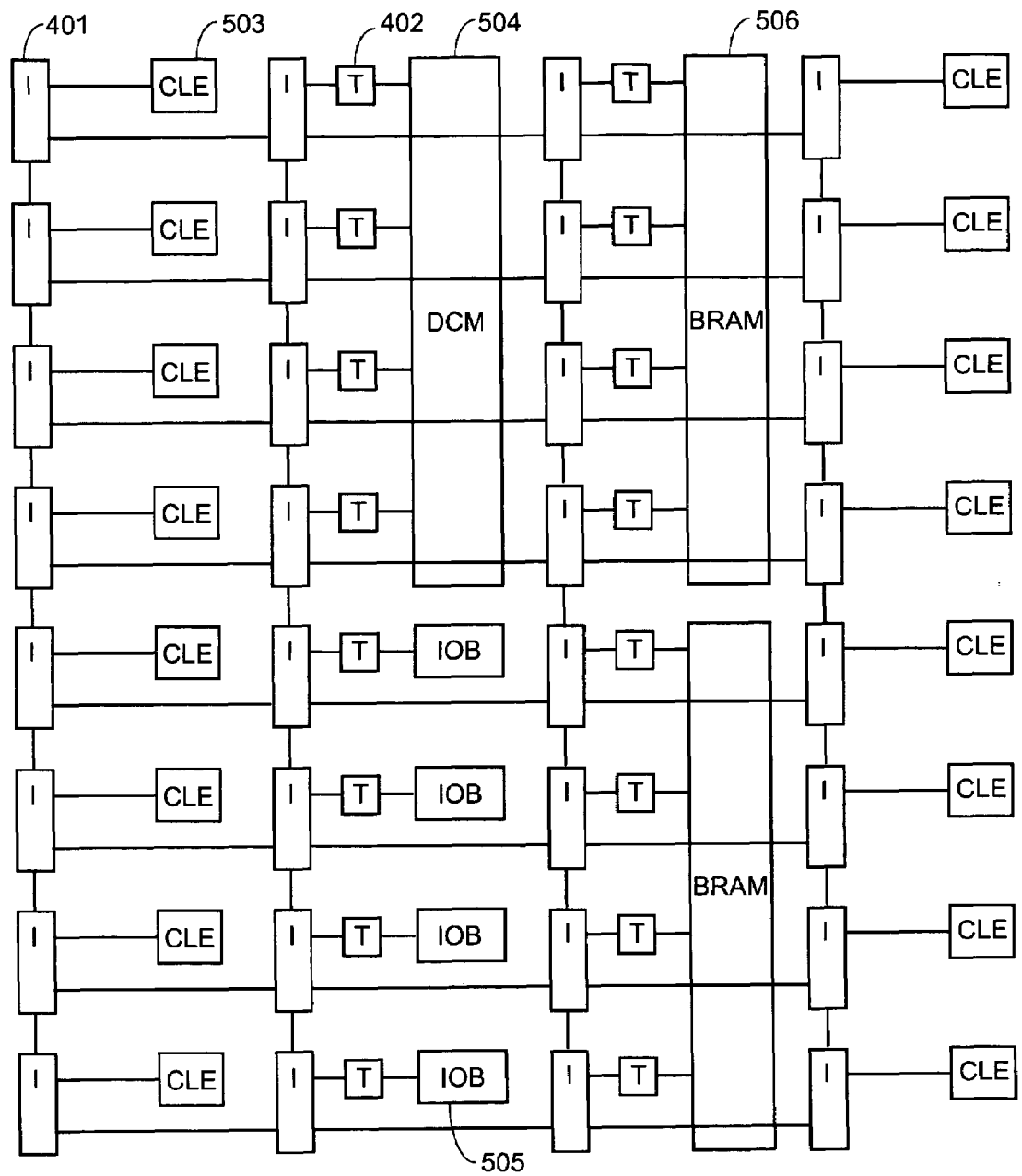
FIG. 6 is a block diagram of a second PLD array that includes the testing structure and standardized interconnect block of FIG. 4 in a non-homogeneous array of logic blocks.

FIG. 6 is a block diagram of a second PLD array that can include, for example, the standardized testing structure and standardized interconnect block of FIG. 4 in a non-homogeneous array of logic blocks. The embodiment of FIG. 6 is similar to that of FIG. 5, except that in FIG. 6 the CLE logic blocks 503 are directly coupled to their associated standardized interconnect blocks. In other words, the standardized test structures are omitted for the CLEs. As described above, in this embodiment the CLEs are configured to mimic the behavior of the standardized test structures by implementing the logic of the test structures when the test structures are in test mode. In some embodiments, the standardized test structures are omitted for the CLEs, but the CLEs do not exactly mimic the behavior of the standardized test structures. Instead, the test patterns for the CLE interconnect structures are slightly modified to accommodate this variation.

In some embodiments, the standardized test structures are omitted for other logic blocks, e.g., the block RAMs (BRAMs). In these embodiments, the test patterns for the BRAMs are modified to accommodate, for example, the clock cycles required to load data into the BRAM memory.

Figure 7:
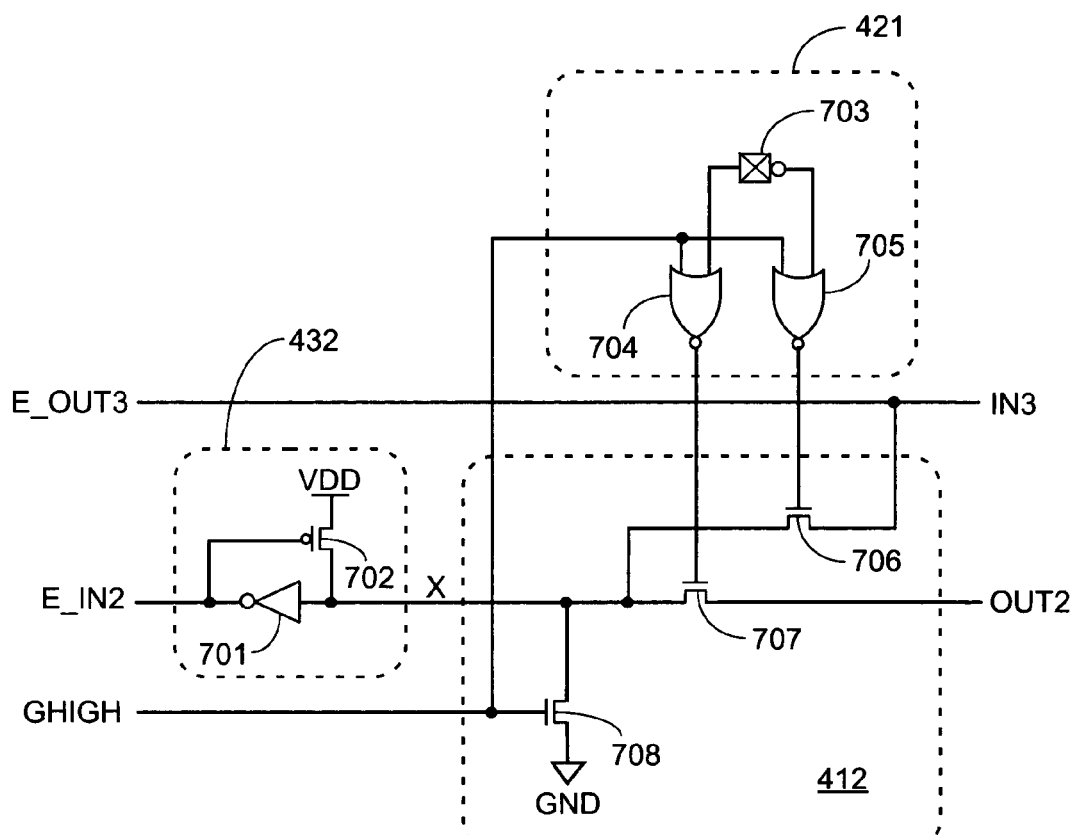
FIG. 7 shows one possible implementation of the multiplexers and buffers included in the embodiment of FIG. 4.

FIG. 7 shows one implementation of the multiplexers and buffers included in the embodiment of FIG. 4. For example, the circuit of FIG. 7 can be used to implement MUX 412, memory cell 421, and buffer 432 of FIG. 4. In the embodiment of FIG. 7, MUX 412 includes transistors 706–707 and pull-down 708. Memory cell 421 includes configuration memory cell 703 and NOR gates 704–705.

In the embodiment of FIG. 7, the configuration memory cells of the PLD (including configuration memory cell 703) assume a low value by default, and during configuration the signal GHIGH is driven to a high value. (In some known FPGAs, the signal GHIGH is used to prevent contention by ensuring that all interconnect lines are forced to a high value during the configuration process.) Thus, during configuration signal GHIGH turns on pull-down 708, pulling node X low, and driving signal E_IN2 high through inverting buffer 432.

After configuration, if configuration memory cell 703 stores a high value, the circuit is in test mode. NOR gate 704 provides a low value to the gate terminal of transistor 707, turning off transistor 707. At this point (after configuration) signal GHIGH is low, so NOR gate 705 provides a high value to the gate terminal of transistor 706. Thus, signal E_OUT3 from the associated interconnect block is passed through transistor 706 to node X, through inverting buffer 432, and hence to terminal E_IN2 of the associated interconnect block.

If after configuration memory cell 703 stores a low value, the circuit is in user operational mode. NOR gate 705 provides a low value to the gate terminal of transistor 706, turning off transistor 706. At this point (after configuration) signal GHIGH is low, so NOR gate 704 provides a high value to the gate terminal of transistor 707. Thus, signal OUT2 from the associated logic block is passed through transistor 707 to node X, and hence through inverting buffer 432 to terminal E_IN2 of the associated interconnect block.

In the pictured embodiment, inverting buffer 432 includes an inverter 701 driven by node X and driving input terminal E_IN2 of the associated standardized interconnect structure. Buffer 432 also includes a pull-up 702 on the inverter input terminal (node X) gated by the inverter output terminal (E_IN2). Pull-up 702 pulls the buffer input signal to the rail (power high VDD) when signal E_IN2 goes low.

In one embodiment, the transistors in NOR gates 704–705 and transistors 706–707 are manufactured using a thicker oxide than the other transistors in the circuit and a pumped up voltage high value is used for NOR gates 704–705. The advantage of this implementation is that transistors 706–707 have a higher performance when they are turned on, and a lower leakage current when they are turned off.

Figure 8:
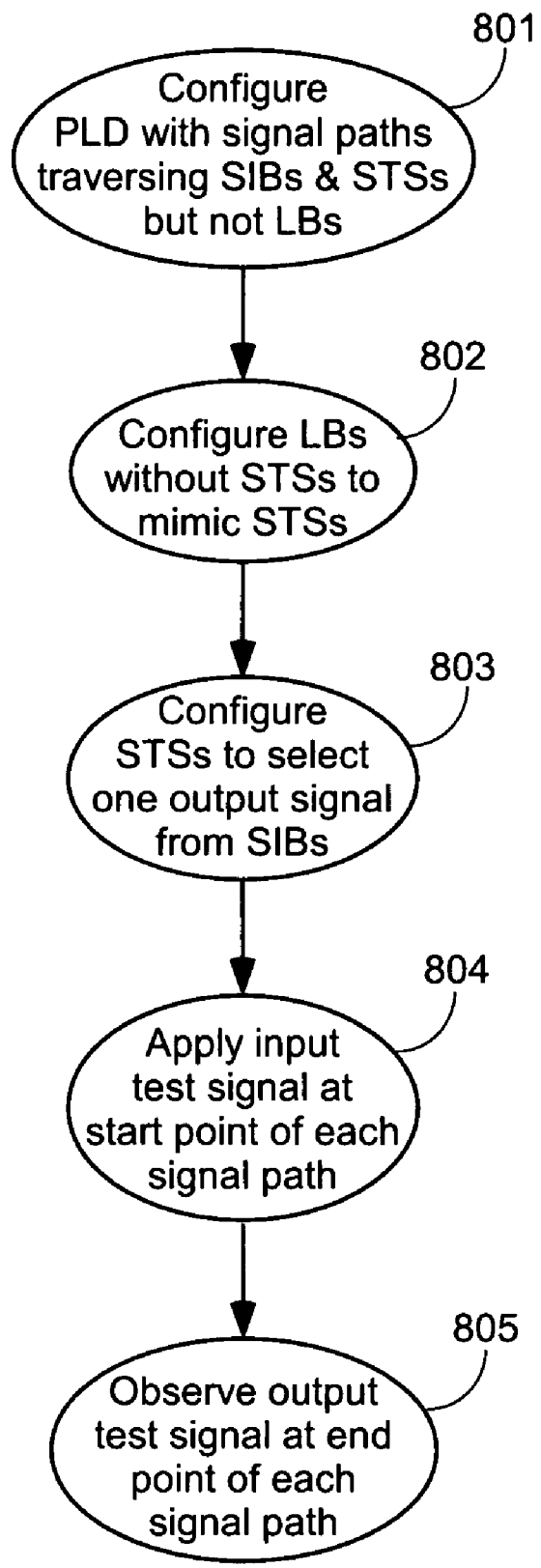
FIG. 8 shows the steps of a method of testing a PLD interconnect structure, according to an embodiment of the present invention.

FIG. 8 shows the steps of a method of testing programmable interconnect in a PLD, according to an embodiment of the present invention. The PLD includes an array of standardized interconnect blocks coupled to one another, an array of standardized test structures each coupled to and associated with one of the interconnect blocks, and a non-homogeneous array of programmable logic blocks each coupled to and associated with at least one of the test structures.

In step 801, the PLD is configured with a configuration containing signal paths that traverse the standardized interconnect blocks (SIBs) and the standardized test structures (STSs) and bypass the logic blocks (LBs). The configuration is the same for each of the standardized interconnect blocks and standardized test structures associated with each of the logic blocks.

Optional step 802 applies to PLDS in which the non-homogeneous array of programmable logic blocks includes additional logic blocks coupled directly to their associated interconnect blocks. In step 802, the additional logic blocks in the PLD are configured to mimic the behavior of the standardized test structures in test mode. Step 802 can occur, for example, in the same configuration procedure as step 801, or before in or after step 801.

Optional step 803 applies to PLDs in which the standardized test structures each include one or more test MUX circuits. In step 803, each test structure is configured to select one of at least two output signals from an associated interconnect block to add to a signal path through the test structure. Step 803 can occur, for example, in the same configuration procedure as step 801 and/or 802, or before or after either of steps 801 and 802.

In step 804, an input test signal is applied to a start point of each of the signal paths, and in step 805 an output test signal is observed at an end point of each of the signal paths.

The methods of the present invention can be performed in either hardware, software, or any combination thereof, as those terms are currently known in the art. In particular, the present methods can be carried out by software, firmware, or microcode operating on a computer or computers of any type. Additionally, software embodying the present invention can comprise computer instructions in any form (e.g., source code, object code, interpreted code, etc.) stored in any computer-readable medium (e.g., ROM, RAM, magnetic media, punched tape or card, compact disc (CD) in any form, DVD, etc.). Further, such software can also be in the form of a computer data signal embodied in a carrier wave, such as that found within the well-known Web pages transferred among computers connected to the Internet. Accordingly, the present invention is not limited to any particular platform, unless specifically stated otherwise in the present disclosure.

Those having skill in the relevant arts of the invention will now perceive various modifications and additions that can be made as a result of the disclosure herein. For example, the above text describes the structures and methods of the invention in the context of field programmable gate arrays (FPGAs). However, the structures and methods of the invention can also be applied to other reprogrammable PLDs.

Further, transistors, transmission gates, pass gates, NOR gates, inverters, buffers, pull-ups, pull-downs, configuration memory cells, multiplexers, logic blocks, PLDs, FPGAs, and other components other than those described herein can be used to implement the invention. Active-high signals can be replaced with active-low signals by making straightforward alterations to the circuitry, such as are well known in the art of circuit design. Logical circuits can be replaced by their logical equivalents by appropriately inverting input and output signals, as is also well known.

Moreover, some components are shown directly connected to one another while others are shown connected via intermediate components. In each instance the method of interconnection establishes some desired electrical communication between two or more circuit nodes. Such communication can often be accomplished using a number of circuit configurations, as will be understood by those of skill in the art.

Accordingly, all such modifications and additions are deemed to be within the scope of the invention, which is to be limited only by the appended claims and their equivalents.

What is claimed is:

1. A programmable logic device (PLD), comprising:
    a non-homogeneous array of programmable logic blocks;
    an array of standardized interconnect blocks, each interconnect block being coupled to other interconnect blocks adjacent thereto in the array; and
    an array of standardized test structures, each test structure being coupled between one of the interconnect blocks and one of the logic blocks.

2. The PLD of claim 1, wherein the non-homogeneous array of programmable logic blocks includes additional logic blocks coupled directly to the interconnect blocks, in addition to at least two different types of the logic blocks that are coupled to the standardized test structures.

3. The PLD of claim 1, wherein the non-homogeneous array of programmable logic blocks includes at least two of the following types of logic blocks: configurable logic elements (CLEs), input/output blocks (IOBs), random access memory blocks (BRAMs), and digital clock manager blocks (DCMs).

4. The PLD of claim 3, wherein the non-homogeneous array of programmable logic blocks includes a plurality of CLEs coupled directly to the interconnect blocks, in addition to at least two different types of the logic blocks that are coupled to the standardized test structures.

5. The PLD of claim 1, wherein all of the standardized interconnect blocks are logically equivalent.

6. The PLD of claim 1, wherein:
    each logic block comprises an input terminal and an output terminal;
    each standardized interconnect block comprises an output terminal coupled to the input terminal of an associated logic block and further comprises an input terminal; and
    each standardized test structure comprises a first multiplexer (MUX) having input terminals coupled to the input and output terminals of an associated logic block, an output terminal coupled to the input terminal of an associated standardized interconnect block, and a select input terminal.

7. The PLD of claim 6, wherein the select terminal of the multiplexer is coupled to a configuration memory cell.

8. The PLD of claim 6, wherein each standardized test structure further comprises a plurality of additional MUXes coupled between input and output terminals of the associated logic block and input terminals of the associated standardized interconnect block, the plurality of additional MUXes each having a select input terminal coupled to the select input terminal of the first MUX in the same standardized test structure.

9. The PLD of claim 8, wherein the select input terminals of the first MUX and the additional MUXes in each standardized test structure are each controlled independently of the other standardized test structures.

10. The PLD of claim 9, wherein the select input terminals of the first MUX and the additional MUXes in each standardized test structure are controlled by a single configuration memory cell.

11. The PLD of claim 6, wherein each standardized test structure further comprises a second MUX, the second MUX comprising:
    a select input terminal;
    an output terminal coupled to an input terminal of the first MUX;
    a first input terminal coupled to the input terminal of the associated logic block; and
    a second input terminal coupled to a second input terminal of the associated logic block and further coupled to a second output terminal of the associated standardized interconnect block.

12. The PLD of claim 11, wherein each standardized test structure further comprises first and second configuration memory cells coupled to the select input terminals of the first and second MUXes, respectively.

13. The PLD of claim 1, wherein the PLD is a field programmable gate array (FPGA).

14. A method of testing programmable interconnect in a programmable logic device (PLD), the PLD comprising an array of standardized interconnect blocks coupled to one another, an array of standardized test structures each coupled to and associated with one of the interconnect blocks, and a non-homogeneous array of programmable logic blocks each coupled to and associated with at least one of the test structures, the method comprising:

configuring the PLD with a configuration containing signal paths that traverse the standardized interconnect blocks and the standardized test structures and bypass the logic blocks, the configuration being the same for each of the standardized interconnect blocks and standardized test structures associated with each of the logic blocks;

applying an input test signal to a start point of each of the signal paths; and observing an output test signal at an end point of each of the signal paths.

15. The method of claim 14, wherein the non-homogeneous array of programmable logic blocks includes additional logic blocks coupled directly to the interconnect blocks, and the method further comprises configuring the additional logic blocks to mimic behavior of the standardized test structures in a test mode.

16. The method of claim 14, wherein the non-homogeneous array of programmable logic blocks includes at least two of the following types of logic blocks: configurable logic elements (CLEs), input/output blocks (IOBs), random access memory blocks (BRAMs), and digital clock manager blocks (DCMs).

17. The method of claim 16, wherein the non-homogeneous array of programmable logic blocks includes CLEs coupled directly to the interconnect blocks, and the method further comprises configuring the CLEs to mimic behavior of the standardized test structures in a test mode.

18. The method of claim 14, wherein configuring the PLD comprises configuring each test structure to select one of at least two output signals from an associated interconnect block to add to a signal path through the test structure.

19. The method of claim 14, wherein the PLD is a field programmable gate array (FPGA).

20. A computer-readable storage medium comprising computer-executable code for testing programmable interconnect in a programmable logic device (PLD), the PLD comprising an array of standardized interconnect blocks coupled to one another, an array of standardized test structures each coupled to and associated with one of the interconnect blocks, and a non-homogeneous array of programmable logic blocks each coupled to and associated with at least one of the test structures, the medium comprising:

code for configuring the PLD with a configuration containing signal paths that traverse the standardized interconnect blocks and the standardized test structures and bypass the logic blocks, the configuration being the same for each of the standardized interconnect blocks and standardized test structures associated with each of the logic blocks;

code for applying an input test signal to a start point of each of the signal paths; and code for observing an output test signal at an end point of each of the signal paths.

21. The computer-readable storage medium of claim 20, wherein the non-homogeneous array of programmable logic blocks includes additional logic blocks coupled directly to the interconnect blocks, and the storage medium further comprises code for configuring the additional logic blocks to mimic behavior of the standardized test structures in a test mode.

22. The computer-readable storage medium of claim 20, wherein the non-homogeneous array of programmable logic blocks includes at least two of the following types of logic blocks: configurable logic elements (CLEs), input/output blocks (IOBs), random access memory blocks (BRAMs), and digital clock manager blocks (DCMs).

23. The computer-readable storage medium of claim 22, wherein the non-homogeneous array of programmable logic blocks includes CLEs coupled directly to the interconnect blocks, and the storage medium further comprises code for configuring the CLEs to mimic behavior of the standardized test structures in a test mode.

24. The computer-readable storage medium of claim 20, wherein the code for configuring the PLD comprises code for configuring each test structure to select one of at least two output signals from an associated interconnect block to add to a signal path through the test structure.

25. The computer-readable storage medium of claim 20, wherein the PLD is a field programmable gate array (FPGA).

26. A system for testing programmable interconnect in a programmable logic device (PLD), the PLD comprising an array of standardized interconnect blocks coupled to one another, an array of standardized test structures each coupled to and associated with one of the interconnect blocks, and a non-homogeneous array of programmable logic blocks each coupled to and associated with at least one of the test structures, the system comprising:

a configuration module for configuring the PLD with a configuration containing signal paths that traverse the standardized interconnect blocks and the standardized test structures and bypass the logic blocks, the configuration being the same for each of the standardized interconnect blocks and standardized test structures associated with each of the logic blocks;

a test input module for applying an input test signal to a start point of each of the signal paths; and a test observation module for observing an output test signal at an end point of each of the signal paths.

27. The system of claim 26, wherein the non-homogeneous array of programmable logic blocks includes additional logic blocks coupled directly to the interconnect blocks, and the system further comprises an additional configuration module that configures the additional logic blocks to mimic behavior of the standardized test structures in a test mode.

28. The system of claim 26, wherein the non-homogeneous array of programmable logic blocks includes at least two of the following types of logic blocks: configurable logic elements (CLEs), input/output blocks (IOBs), random access memory blocks (BRAMs), and digital clock manager blocks (DCMs).

29. The system of claim 28, wherein the non-homogeneous array of programmable logic blocks includes CLEs coupled directly to the interconnect blocks, and the system further comprises an additional configuration module that configures the CLEs to mimic behavior of the standardized test structures in a test mode.

30. The system of claim 26, wherein the configuration module configures each test structure to select one of at least two output signals from an associated interconnect block to add to a signal path through the test structure.

31. The system of claim 26, wherein the PLD is a field programmable gate array (FPGA).

* * * * *